United States Patent [19]

Wu et al.

[11] Patent Number: 4,794,565
[45] Date of Patent: Dec. 27, 1988

[54] ELECTRICALLY PROGRAMMABLE MEMORY DEVICE EMPLOYING SOURCE SIDE INJECTION

[75] Inventors: Albert T. Wu, Berkeley; Ping K. Ko, Hercules; Tung-Yi Chan, Berkeley; Chenming Hu, Hercules, all of Calif.

[73] Assignee: The Regents of the University of California, Berkeley, Calif.

[21] Appl. No.: 907,564

[22] Filed: Sep. 15, 1986

[51] Int. Cl.[4] .................... G11C 7/00; G11C 11/40; H01L 29/78
[52] U.S. Cl. .................... 365/185; 365/189; 357/23.5
[58] Field of Search .................... 357/23.5-.6, 357/54, 23.9, 13; 365/189, 185, 184, 104

[56] References Cited

U.S. PATENT DOCUMENTS

| | | | |
|---|---|---|---|
| 4,087,795 | 5/1978 | Rossler | 365/185 X |
| 4,115,914 | 9/1978 | Harari | 365/184 |
| 4,193,080 | 3/1980 | Koike et al. | 357/23.5 |
| 4,203,158 | 5/1980 | Frohman - Bentchk | 365/185 X |
| 4,297,719 | 10/1981 | Hsu | 357/23 |
| 4,302,766 | 11/1981 | Guterman et al. | 357/23.5 |
| 4,328,565 | 5/1982 | Harari | 365/185 X |
| 4,361,847 | 11/1982 | Harari | 365/185 |
| 4,409,723 | 10/1983 | Havari | 357/23.5 |
| 4,437,172 | 3/1984 | Masuoka | 365/185 |
| 4,521,448 | 6/1985 | Sasaki | 357/23.5 |
| 4,527,258 | 7/1985 | Guterman | 357/23.5 |
| 4,558,338 | 12/1985 | Sakata | 365/185 |
| 4,652,897 | 3/1987 | Okuyama et al. | 365/185 |

FOREIGN PATENT DOCUMENTS

| | | | |
|---|---|---|---|
| 58-54668 | 3/1983 | Japan | 357/23.5 |
| 59-229874 | 12/1984 | Japan | 357/23.5 |
| 60-182777 | 9/1985 | Japan | 357/23.5 |

OTHER PUBLICATIONS

Int. Symposium on VLSI Tech., SYS and APPL. Technical Papers May 13-15, 1987, "Effects of the Gate-to-Drain/Source Overlap in Mosfet", by Chan et al., pp. 101-105.

Int. Symposium on VLSI Tech., SYS and APPL. Technical Paper May 13-15, 1987, "Uniformity and Process Control of Gate Current Characteristics in Two Source-Side Injections Eprom Technologies", by A. T. Wu, pp. 246-250.

Primary Examiner—Stuart N. Heckler
Assistant Examiner—Alfonso Garcia
Attorney, Agent, or Firm—Townsend and Townsend

[57] ABSTRACT

An electrically programmable and eraseable memory element using source-side hot-electron injection. A semi-conductor substrate of a first conductivity type is provided with a source region and a drain region of opposite conductivity type and a channel region of the first conductivity type extending between the source and drain regions. A control gate overlies the channel region, and a floating gate insulated from the control gate, the source and drain regions and the channel region is located either directly underneath the control gate over the channel region, partially underneath the control gate over the channel region or spaced to the source side of the control gate. A weak gate control region is provided in the device near the source so that a relatively high channel electric field for promoting hot-electron injection is created under the weak gate control region when the device is biased for programming.

2 Claims, 7 Drawing Sheets

FIG._11.  ▨ = POLY-SILICON

ELECTRICALLY PROGRAMMABLE MEMORY DEVICE EMPLOYING SOURCE SIDE INJECTION

This invention was made with government support under Contract No. N00039-81-K-0251 awarded by the Department of the Navy, Space and Naval Warfare Systems Command.

BACKGROUND OF THE INVENTION

This invention relates to electrically programmable and erasable memory devices of the type employing hot electron injection.

Electrically programmable and erasable memory devices employing hot electron injection are known. An example of such a device is described in U.S. Pat. No. 4,087,795. Briefly, such devices include a floating gate surmounted by a conductive control gate and separated therefrom by an insulator. In such devices, programming is achieved by means of the avalanche effect in accordance with which the floating gate is charged with carriers that are heated, or have relatively greater energy levels, as a result of the avalanche breakdown at the interface between the drain and the substrate, upon the breakdown of this otherwise non-conducting p-n junction. Due to their increased energy, these carriers can pass through the insulator, particularly if a voltage accelerating them is applied between the substrate and the floating gate. In such drain side channel hot electron injection devices, the injection current can be enhanced by increasing either the channel field or the gateoxide field. However, low gate and high drain voltages are required to generate the high channel field, while the exact opposite biasing condition—i.e., low drain and high gate voltages—is needed to create the high gate-oxide field. Because of these conflicting conditions, optimization of the performance of such devices is difficult to achieve. In practice, very high drain and gate voltages are typically used as a compromise: however, under such voltage biasing, a typical device is subjected to biasing conditions which are very close to the breakdown voltages. As a result, there exists an extremely small tolerance window for device design and process control.

A further disadvantage inherent in drain-side channel hot-electron injection devices is the relatively low hot-electron injection efficiency (defined as the ratio of the number of electrons injected into the floating gate to the number of electron-hole pairs generated in the device channel), which is lower than $10^{-7}$ and which severely limits the maximum programming speed. Conventional attempts to increase the programming speed typically involve scaling down the physical dimensions of the devices: however, a reduction in physical dimensions is usually accompanied by a decrease in device yield during batch processing and a deterioration in the ability of the devices to maintain their programmed or erased state over time.

A still further disadvantage with drain-side channel hot-electoon injection devices resides in the fact that the relatively high drain and gate voltages used to bias such devices during programming typically necessitates use of at least one separate power supply in order to generate the programming and erasing voltages, which are not otherwise required for the operation of circuits employing such devices.

SUMMARY OF THE INVENTION

The invention comprises a source-side channel hot-electron injection device which is devoid of the disadvantages noted above, and several methods of fabricating same.

From a device aspect, the invention comprises a memory element including a substrate of a first conductivity type, a source region, a drain region, a channel region extending between the source region and the drain region, a control gate overlying at least a portion of the channel region, a floating gate which is insulated from the control gate, the source and drain regions and the channel region, and means for providing a weak gate control region near the source so that a relatively high channel electric field for promoting hot-electron injection is created under the weak gate control region when the device is biased for programming.

In one embodiment of the invention, the control gate and the floating gate are mutually aligned in a stacked configuration with one edge of each of the gates closely adjacent the drain region. In this embodiment, the means for providing the weak gate control region comprises a gap between the opposite edges of each of the gates and the source region. In a variation of this embodiment, the means for providing a waak gate control region further includes a side wall spacer insulated from the source region, the control gate and floating gate, the spacer being located closely adjacent the source region and spaced from the opposite edges of the control gate and the floating gate to provide a gap therebetween.

In another embodiment of the invention, the floating gate is located adjacent the control gate over the channel region and overlapping a portion of the source region. In this embodiment, the means for providing the weak gate control region comprises a gap between the floating gate and the control gate.

In another embodiment of the invention, the floating gate has a first edge overlapping a portion of the drain region and an opposite edge located over the channel region, while the control gate partially overlies the floating gate and a portion of the source region. In this embodiment, the means for providing the weak gate control region comprises a gap between the control gate and the floating gate.

In another embodiment of the invention, the floating gate has a first edge overlying a portion of the drain region and an opposite edge located over the channel region, and the control gate completely overlies the floating gate, a portion of the drain region and a portion of the channel extending from the source to the opposite edge of the floating gate. In this embodiment, the means for providing the weak gate control region comprises a gap between the control gate and the opposite edge of the floating gate.

In all of the above alternate embodiments, the gap size is preferably in the range from about 800–3000 Å.

The several emodiments are all fabricated using either NMOS or CMOS processing technology, with the steps being performed in accordance with the individual requirements of the particular embodiment to be produced.

Thus, for example, in the first embodiment noted above the method comprises the steps of forming a stacked control gate/floating gate structure over an insulator covered surface of a semi-conductor; covering the gate structure with an insulating layer; forming an additional floating gate spaced laterally from one edge of the gate structure by a predetermined amount substantially equal to the desired length of the weak control region; forming a source region in the semi-conductor in the region thereof adjacent the additional floating gate and a drain region in the semi-conductor in the region thereof adjacent the opposite edge of the gate structure; and removing the additional floating gate structure, which serves as a shield during the source formation step. In variation of this emodiment, the method is identical to the first method, with the exception that the additional floating gate structure is not removed and functions as the side wall spacer. In both of the above methods, the step of forming the additional floating gate includes the steps of covering the insulating layer with a gate material layer; removing top portions of the gate material layer to form a pair of additional floating gates flanking the gate structure; and removing one of the pair of additional floating gates. In a variation of the first method, the two initial steps of forming a stacked control gate/floating gate structure and covering the gate structure with an insulating layer are performed, followed by the step of forming a source region in the semi-conductor separately laterally from one edge of the gate structure and a drain region in the semi-conductor adjacent the opposite edge of the gate structure by angled ion implantation.

A method of fabricating the third embodiment noted above proceeds by forming a control gate over an insulator covered surface of a semi-conductor; forming a floating gate laterally spaced from one edge of the control gate by a predetermined amount substantially equal to the desired length of the weak gate control region; and forming a source region in the semi-conductor in the region thereof adjacent the floating gate and a drain region in the semi-conductor in the region thereof adjacent the oppposite edge of the control gate. The step of forming the floating gate preferably includes the steps of covering the control gate with an insulating layer having a thickness substantially equal to the desired length of the weak gate control region; covering the insulating layer with a gate material layer; removing top portions of the gate material layer to form a pair of floating gates flanking the control gates; and removing one of the pair of floating gates.

A method for fabricating the fourth embodiment noted above proceeds with the steps of forming a floting gate over an insulator covered surface of the semiconductor; forming a control gate at least partially overlying the floating gate and overlapping a prospective source region of the semi-conductor, the control gate being insulatively spaced from one edge of the floating gate by a predetermined amount substantially equal to the desired length of the weak gate control region; and forming a source region in the semi-conductor in the prospective source region and a drain region in the semi-conductor in the region thereof adjacent the opposite edge of the floating gate. The step of forming the control gate preferably includes the steps of covering the floating gate with an insulating layer having a thickness less than the predetermined amount; forming a pair of insulative spacers flanking the floating gate, each spacer having a thickness substantially equal to the predetermined amount; depositing a layer of control gate material over the insulating layer and the insulative spacers; and selectively removing the layer of control gate material.

In the method of fabricating the last noted embodiment above, the method proceeds by forming a floating gate over an insulator covered surface of a semi-conductor; forming drain region in the semi-conductor adjacent one edge of the floating gate; forming a control gate overlying the floating gate and a portion of the drain region, the control gate being insulatively spaced from the opposite edge of the floating gate by a predetermined amount substantially equal to the desired length of the weak gate control region and extending from the opposite edge to a prospective source region; and forming a source region in the semi-conductor in the prospective source region and a drain region in the semi-conductor in the prospective drain region.

The invention provides electrically programmable and erasable memory elements which possess a relatively high hot electron injection efficiency, which affords a relatively high programming speed. In addition, such devices require relatively low programming voltages, to be applied at the drain terminals. Although higher voltages must be applied to the gates during programming and to the gates or the sources or the drains during erasing, only minute amounts of current on the order of microamperes are drawn at these higher voltages, which can thus be generated by on-chip charge pumping circuitry, thereby eliminating the need for a separate power supply for programming and erasing. Further, hhe fabrication processes required to produce devices according to the invention are completely compatible with conventional EPROM process and MOSFET technology, requiring no difficult or unusual process steps. In addition, since such devices are biased far below their breakdown voltages during programming, a large safety margin exists for both device design and process control. In addition, since the individual devices are relatively simple in geometry, they may be fabricated using substantially the same area as a conventional EPROM cell, which is substantially smaller than the area required for a conventional tunnel-oxide EEPROM cell. Further, devices fabricated according to the invention exhibit improved soft-write endurance.

For a fuller understanding of the nature and advantages of the invention, reference should be had to the ensuing detailed description taken in conjunction with the accompanying drawings.

BRIEF DESCRIPTION OF THE DRAWINGS

FIGS. 2A-2D are sequential schematic sectional views illustrating the fabrication steps for the FIG. 1 embodiment.

FIGS. 11A-11D are schematic side sectional views illustrating the fabrication steps for the FIG. 10 embodiment;

FIGS. 13A—13E are schematic side sectional views illustrating the fabrication steps for the FIG. 12 embodiment.

DESCRIPTION OF THE PREFERRED EMBODIMENTS

Figure 1:
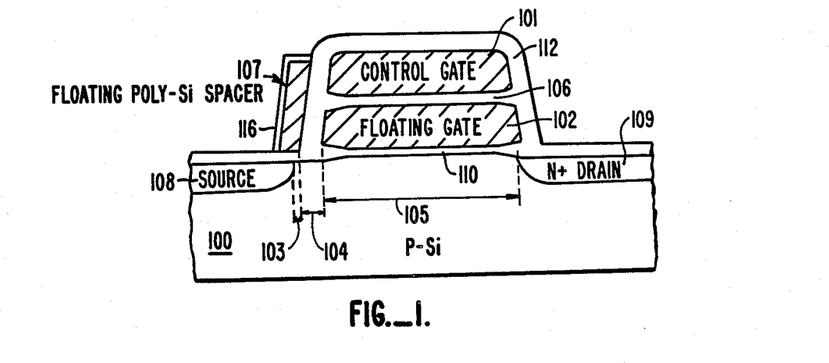
FIG. 1 is a side sectional view of a first embodiment of the invention.

Turning now to the drawings, FIG. 1 is a sectional view of a preferred embodiment of the invention. As seen in this FIGURE, a semi-conductor substrate 100 of a first conductivity type (P-type) has a source region 108 and a drain region 109 of opposite conductivity type (N-type) formed therein. Extending between the source 108 and the drain 109 regions is a channel region which comprises three distinct regions: a region 103 located adjacent source region 108, a region 105 extending from an edge of a floating gate 102 to the drain region 109, and a region 104 lying between regions 103 and 105. The floating gate 102 is surmounted by a control gate 101, and both gates 101 and 102 are surrounded by a dielectric material 112 which also extends over the surface of substrate 100, source region 108, and drain region 109.

Positioned above the channel edge of source region 108 and to the side of gates 101, 102 is a spacer 107. The distance between the lower edge of spacer 107 and the proximate edge of gate 102 defines the width of channel region 104.

Control gate 101, floating gate 102 and spacer 107 are all fabricated from a suitable polysilicon material. The dielectric 106 may comprise any suitable dielectric material, such as silicon dioxide, silicon nitride, tantalum oxide, and composite dielectric materials such as oxide-nitride or oxide-nitride-oxide. As is evident from the FIGURE, the control gate 101, the interpoly dielectric 106 and the floating gate 102 form a stacked-gate.

Figure 2:
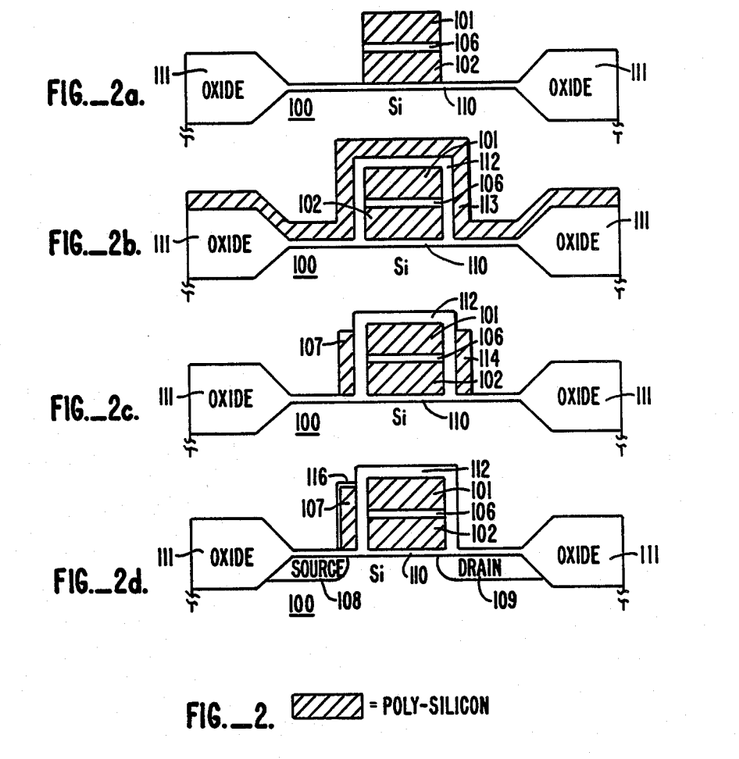
FIG. 2 is a legend for FIGS. 2A-2D.

With reference to FIG. 2, the device of FIG. 1 may be fabricated in the following fashion. An oxide device isolation 111 is first formed in the silicon substrate 100, after which the first gate dielectric 110 is formed. Thereafter, a first layer of polysilicon is deposited over the gate dielectric 110, after which the dielectric 106 is formed. Thereafter, the first floating gate 102 is patterned along with the dielectric 106 lying above floating gate 102 using a conventional photoresist technique. Next, a second layer of polysilicon is deposited, after which the self-aligned stacked gate structure illustrated in FIG. 2A is patterned and formed. Next, the stacked gate is oxidized to form a spacer oxide 112 on the top and sides of the stacked gate to a thickness which is equal to the length of the weak gate control channel region 104. Thereafter, a third layer of polysilicon 113 (FIG. 2B) is deposited, after which a pair of flanking polysilicon side wall spacers 107, 114 are formed by anisotropic etching of layer 113 (FIG. 2C). Next, the spacer 114 is etched away using a photoresist masking step, after which an oxide protection layer 116 is formed on now- formed spacer 107. This is followed by ion implantation and drive-in to form source region 108 and drain region 109 (FIG. 2D). Thereafter, conventional process steps which are standard for CMOS processing are conducted to complete the device.

Critical to the performance of the device is the length of the weak gate control region 104 extending between hhe spacer 107 and the stacked gate structure. If this length is too small, the device will degenerate into a conventional drain-side injection cell. On the other hand, if the length is too large, the device will suffer from low reading current and, in the extreme case, slow programming. For current technology, with a channel length of 1 $\mu$m, a gate oxide thickness of from 200 to 400 Å, and substrate doping of $10^{16}$ to 5 times $10^{16}$ cm-3, the optimum length of the weak gate control region 104 ranges from about 800 to about 3000 Å. The lower limit of this range is expected to become smaller as future improvements in processing technology permit the dimensions of such devices to become smaller.

Figure 3:
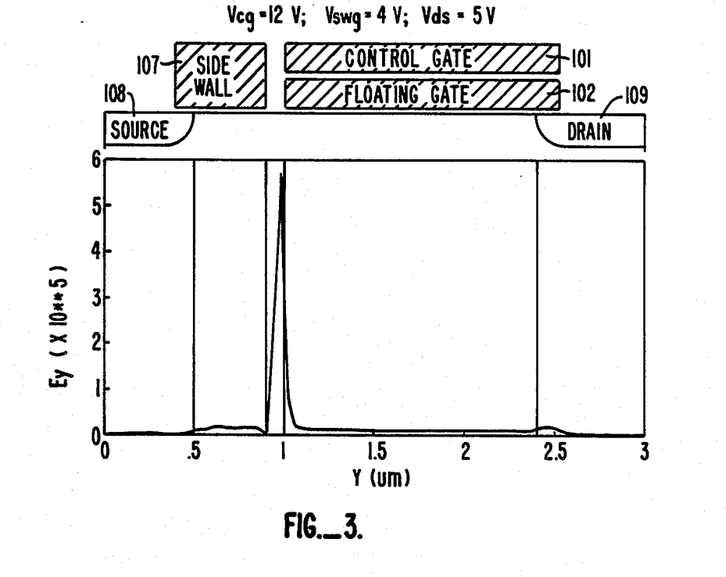
FIG. 3 is a field-distance plot illustrating the programming state of the FIG. 1 device.

With reference to FIG. 1, in use a gate voltage is applied to control gate 101. The floating gate 102 is used for charge storage. The channel region 104 between the stacked gate and the floating polysilicon spacer 107 forms a weak gate control region which enables source-side injection of hot electrons into the floating gate. With reference to FIG. 3, which is a simulation of the electric field in the region between the source and drain of the device of FIG. 1, with the control gate 101 biased to 12 volts, and the drain region 109 biased at five volts, a high channel electric field permitting hot electron injection is created under the weak gate control region 104. Under such biasing conditions, the floating gate voltage is much higher than the channel surface potential at the point where hot electrons are generated. Therefore, the oxide field strongly favors hot electron injection into the floating gate. Thus, a large number of hot electrons can be generated with a device biased at voltages far below the normal breakdown voltages, which provides a large safety margin for device design and process control. In addition, the hot electron injection efficiency is higher than $10^{-5}$, which is two orders of magnitude higher than that of conventional EPROM cells. As a result of this relatively high injection efficiency, the pogramming speed is greatly increased over prior art devices.

Figure 4A:
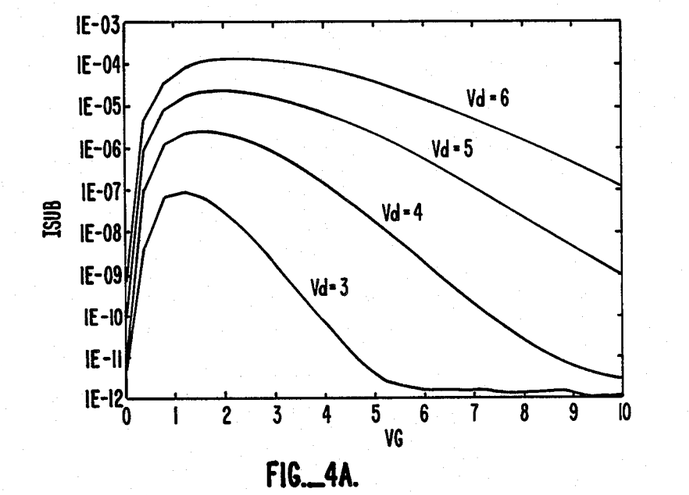
FIGS. 4A and 4B are comparative plots of ISUB and VG with different VD for a conventional MOSFET and the FIG. 1 device.
Figure 4B:
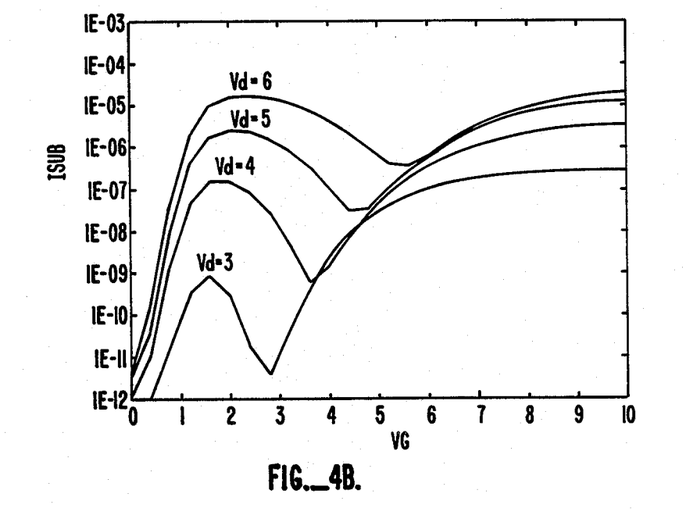

FIG. 4A is a plot of substrate current vs. gate voltage for drain voltages of three, four, five and six volts for a conventional drain-side injection device; while FIG. 4B is a similar plot for the invention of FIG. 1. As can be seen from a comparison of these two figures, the substrate current characteristics of the invention exhibit a double-humped shape having a second hump wherein the substrate current increases with increasing gate voltage. In contrast, the drain-side device shows declining substrate current with increasing gate voltage after a maximum is quickly achieved. Thus, in devices fabricated according to the invention, thehhigher the gate voltage the greater the quantity of hot electrons generated, which is partially responsible for the mproved programmability of the invention.

Figure 5A:
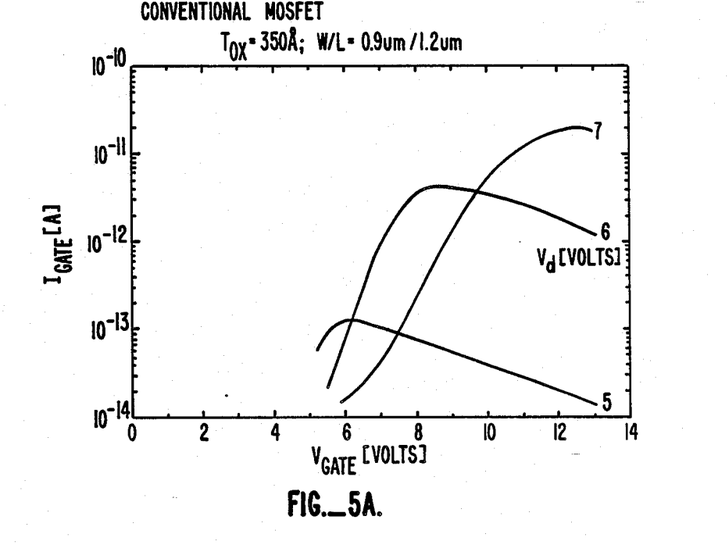
FIGS. 5A and 5B are comparative plots of gate current and gate voltage with different VD for a conventional MOSFET and the FIG. 1 device.
Figure 5B:
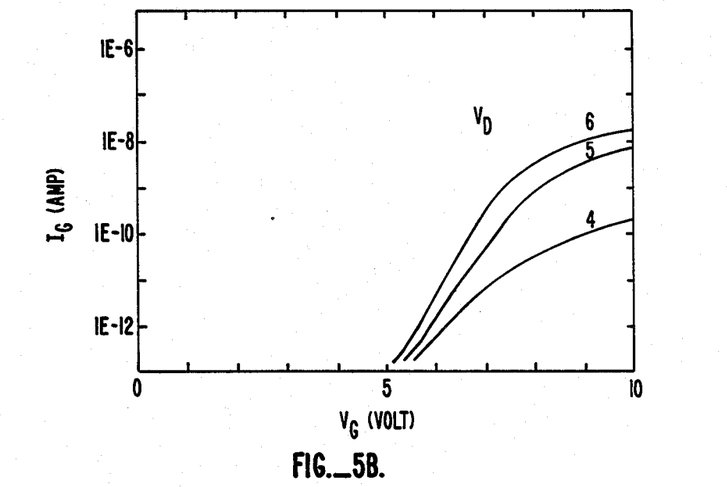

FIG. 5A is a plot of gate current vs. gate voltage for drain voltages of five, six and seven volts for a conventional MOSFET device; while FIG. 5B is a similar plot for the invention. These plots were obtained with the floating gate shorted to the control gate for both the conventional device and the invention of FIG. 1. As seen in these FIGS., the gate current plots of the drain side injection device (FIG. 5A) initially increase with increasing gate voltage, followed by a decrease with further increasing gate voltage. In contrast, the gate currents of the device fabricated according to the invention increase monotonically with increasing gate voltage (FIG. 5B). As a result, the invention is capable of generating a much larger gate current and thus exhibits a faster programming speed than the conventional device.

Figure 6:
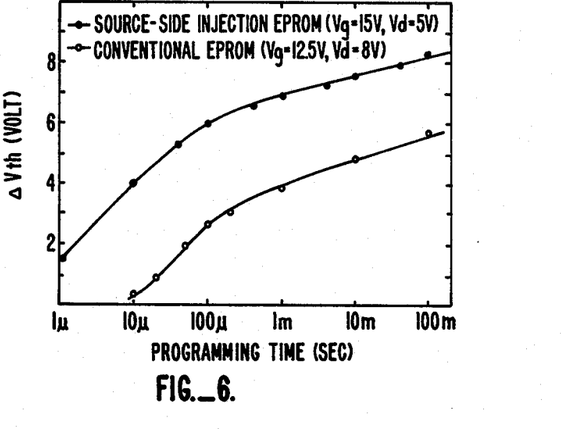
FIG. 6 is a comparative plot of threshold voltage shift and programming time for a conventional EPROM and the FIG. 1 device.

FIG. 6 is a comparative plot of threshold voltage shift vs programming time for a conventional EPROM and the dvvice of FIG. 1 with the gate and drain voltages as noted in the FIG. These plots were obtained with a device configured as in FIG. 1 with a gate length of 1.0 μm, a drain voltage of five volts and a control gate voltage of 15 volts. The conventional EPROM device had a gate oxide thickness of 350 Å and a gate length of 1.2 m, a drain voltage of eight volts and a control gate voltage of 12.5 volts. As can be seen from FIG. 6, the threshold voltage shift for the invention is more than four volts after only 10 microseconds programming time, about two orders of magiitude faster than that of the conventional EPROM device. If the same drain voltage of eight volts is used for both devices, the programming speed of the invention should be about three orders of magnitude faster than that of the conventional device.

The device of FIG. 1 can be erased by irradiation with ultraviolet light to function as an EPROM cell. If control gate 101 is grounded and a high voltage is applied to source region 108 and/or drain region 109 so that electrons can tunnel through the gate dielectric 110 for erasure, the device functions as an EEPROM device. This same EEPROM function can be achieved by applying a high voltage to the control gate 101 and grounding the source region 108 and drain region 109 so that electrons can tunnel through the inter-polysilicon dielectric 106 from the floating gate 102 to the control gate 101.

Figure 7:
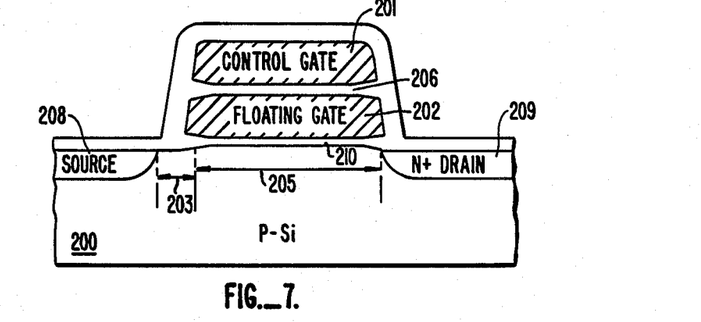
FIG. 7 is a side sectional view of an alternate embodiment of the invention.

FIG. 7 illustrates an alternate embodiment of the invention in which the floating side wall spacer 107 is deleted. The fabrication process is similar to that used for fabricating the device of FIG. 1, with the exception that the film 116 protecting the polysilicon spacer 107 is not grown and the polysilicon side wall spacer 107 on the source side is etched away after the implantation of the source region 208 and drain region 209. Alternatively, the third polysilicon film 113 may be replaced with a CVD oxide film during fabrication.

Figure 8:
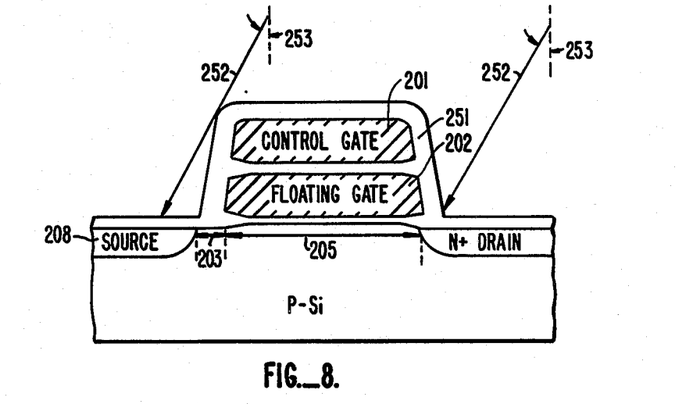
FIG. 8 is a shhematic side sectional view illustrating formation of the FIG. 7 device using angled ion implantation.

Another alternate fabrication technique for the device of FIG. 7 is to use an angled ion implantation schematically depicted in FIG. 8 to create the non-overlapping weak control gate channel region 203 between the edge of the floating gate 202 and the edge of the source region 208. In this alternative technique, the fabrication steps proceed as in FIG. 2 up to the formation of the self-aligned stacked gate structure. Thereafter, an oxidation step is performed to form an oxide layer 251, followed by an ion implantation 252 tilted at an angle 253 relative to the axis normal to the surface of the wafer.

In the device of FIG. 7, the gate voltage is applied to the control gate 201, and the floating gate 202 functions for storing charges. The channel region 203 between the source region 208 and the edge of the floating gate 202 is the weak gate-control region. Operation of this device is similar to that with respect to the device of FIG. 1.

Figure 9:
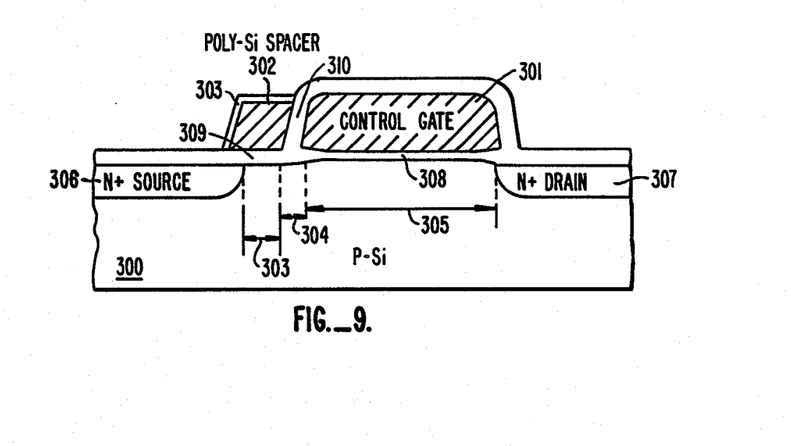
FIG. 9 is a side sectional view of another alternative embodiment of the invention.

FIG. 9 illustrates still another embodiment of the invention in which a polysilicon side wall spacer 302 is used as the floating gate for charge storage. When the floating gate 302 is charged with electrons, the channel region designated with reference numeral 303 is turned off. The channel region 304 between the polysilicon side wall spacer 302 and the control gate 301 comprises the weak gate control region.

The device of FIG. 9 may be fabricated as follows. A device isolation is first formed, followed by formation of the gate dielectric 308. A polysilicon layer is deposited add patterned to form the control gate 301. Thereafter, the polysilicon control gate is oxidized to form an oxide film 310 with a thickness equal to the length of the weak gate control channel region. Thereafter, a second polysilicon layer is deposited over the oxide film 310, after which the polysilicon side wall spacer 302 is formed by anisotropic etching. Next, one side of the spacer 302 is etched by photoresist masking and polysilicon etching. Thereafter, a protective oxide film 303 is grown on the spacer 302, after which source region 306 and drain region 307 are formed by ion implantation and drive-in. The remaining steps of the process follow those of the standard CMOSS process after drain/source formation.

Figure 10:
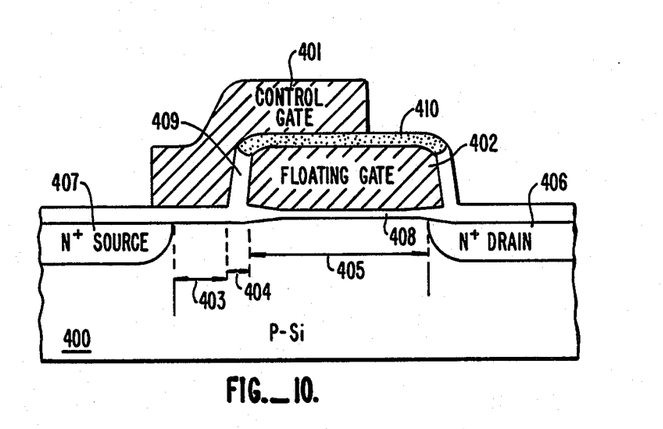
FIG. 10 is a side sectional view of another alternate embodiment of the invention.

FIG. 10 illustrates still another embodiment of the invention having a skewed control gate. In this device, floating gate 402 stores charges, and the channel region 404 located between the inner lower edge of the cnntrol gate 401 and the leading edge of floating gate 402 is the weak gate control region.

Figure 11:
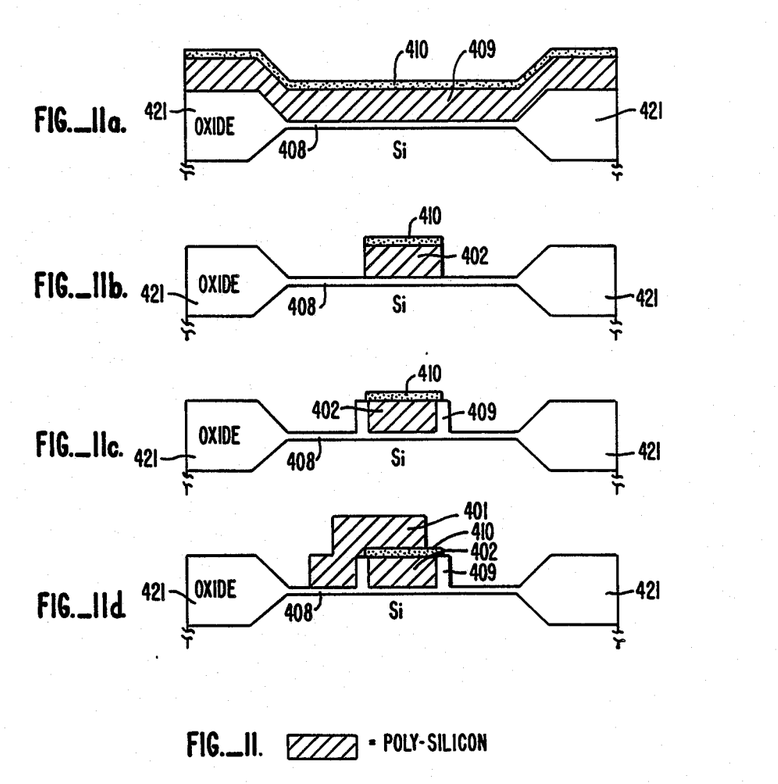
FIG. 11 is a legend for FIGS. 11A-11D.

The device of FIG. 10 may be formed according to the fabrication steps outlined in FIGS. 11A-B. As seen in these FIGS., fabrication commences with the formation of device isolation 421, followed by the formation of gate dielectric 408. Next, a first polysilicon layer 409 is deposited, followed by the deposition of a thin dielectric 410 (FIG. 11A). The thin dielectric 410 and the polysilicon 409 are next patterned using one lithography step to form the floating gate 402 and oxide layer 410( FIG. 11B). Thereafter, the photoresist is removed and the polysilicon floating gate 402 is oxidized to form an oxide spacer 409 of a thickness equal to the desired length of the weak gate control region (FIG. 11C). Thereafter, a second polysilicon layer is deposited and patterned by isotropic etching to form control gate 401 (FIG. 11D). The remaining steps of the process follow those of a standard CMOS process after the polysilicon gate formation.

Figure 12:
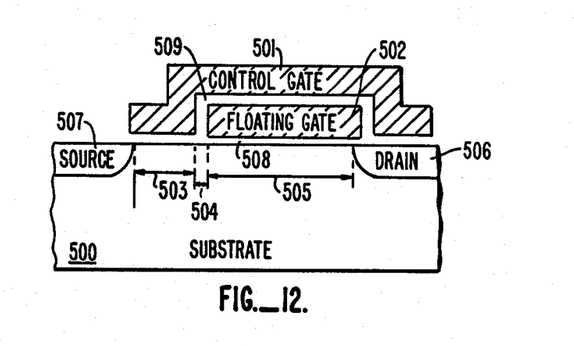
FIG. 12 is a side sectional view of still another alternate embodiment of the invention.

FIG. 12 illustrates still another embodiment of the invention. In this embodiment, the floating gate 502 stores electrons, and the channel region 504 between the lower inner edge of control gate 501 and the lower leading edge of the floating gate 502 is the weak gate control region.

Figure 13:
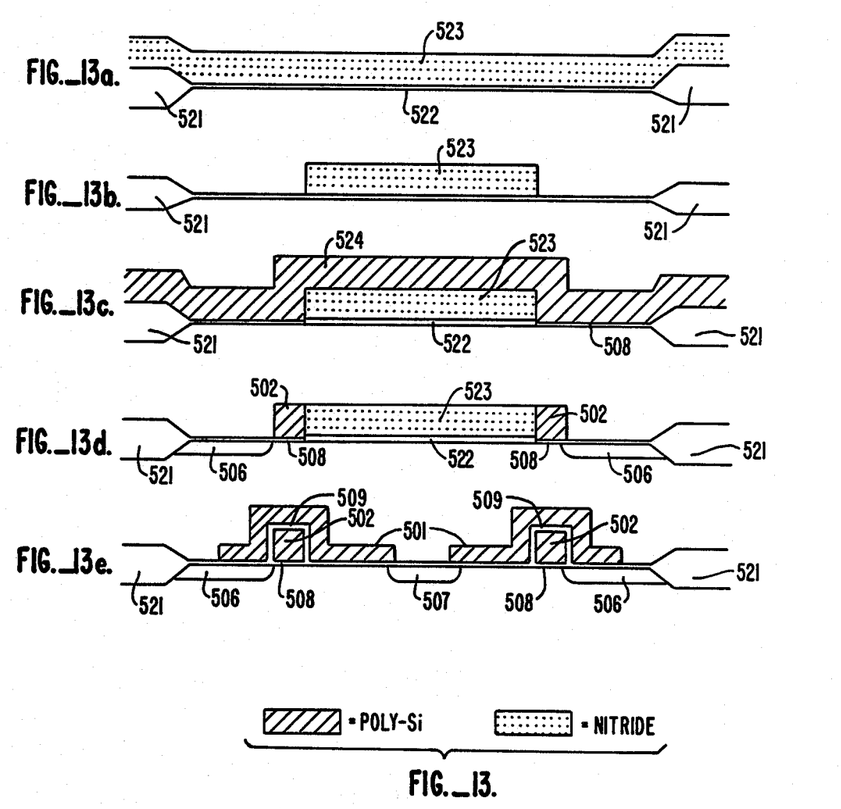
FIG. 13 is a legend for FIGS. 13A-13E.

FIG. 13 illustrates an example of the process steps used in fabricating the device of FIG. 12. As seen in this FIG., device isolation 521 is first formed, followed by formation of an oxide film 522. Thereafter, a nitride film 523 is deposited over the oxide film 522 (FIG. 13A). Thereafter, the nitride film 523 is patterned using a single photolithography step, followed by an- isotropic etching of the nitride film 523 (FIG. 13B). Next, the exposed regions of the oxide film 522 are etched away, followed by gate oxidation to form a gate dielectric 508. Next, the first polysilicon film 524 is deposited (FIG. 13C). Thereafter, a pair of silicon spacers 502 is formed by anisotropic etching of the first polysilicon film 524, followed by ion implantation for the drain regions 506 (FIG. 13D). Next, the nitride 523 is removed by chemical stripping, followed by an oxidation step to form oxide layer 509 with a thickness equal to the desired length of the weak gate control region 504. Thereafter, a second polysilicon layer 501 is deposited and patterned with a photolithography step, followed by ion implantation of the source regions 507 (FIG. 13E). The remaining steps of the process follow those of a standard CMOS process after the source/drain implantation.

As will now be apparent, devices constructed according to the invention exhibit the following advantages:

(1) High programming speed: the hot-electron injection efficiency of the invention is at least two orders of magnitude higher than that of conventional EPROM structures. Therefore, the programming speed is much higher than that of a conventional EPROM.

(2) Low programming voltages: the gate current vs gate voltage characteristics with three different drain voltages were described above with respect to FIG. 5B. A relatively high gate injection of up to 0.1 $\mu$A per $\mu$m channel width is obtained with a drain voltage of five volts and a gate voltage of 10 volts. These programming voltages are far below those used in conventional EPROMs. Since the gate current is relatively small, the gate voltages can be generated by on-chip charge pumping circuitry. Thus, a single power supply, e.g., a standard five volt power supply, is possible for both programming and reading operations. This is particularly significant for EEPROM applications, in which programming and erasing should be done with the device installed on a circuit board.

(3) Easy process control: the critical dimension of the invention is the length of the weak-gate control region under which hot electrons are generated. Since this dimension is the thickness of the oxide formed by oxidation of the gate polysilicon, thickness control is relatively easy to accomplish. In addition, since the dimensions are biased far below their breakdown voltage during programming, a large safety margin exists for device design and process control.

(4) Process compatibility: the fabrication processes of the invention are compatible with conventional EPROM and MOSFET technology. At most, only one extra polysilicon deposition and one extra lithography step are added. Some of the embodiments do not require extra steps at all.

(5) Denser cell for the EEPROMs: the conventional tunnel-oxide EEPROM cell requires a very complicated fabrication process and occupies twice the amount of silicon area than an EPROM cell. EEPROM cells fabricated according to the invention require only relatively simple EPROM technology and occupy about the same area as a conventional EPROM cell.

(6) Flexible reading bias: the asymmetry of the device structures can be utilized to improve soft-write endurance. When the role of the drain and the source is interchanged in reading bias, the gate current injection is supressed. This can prevent the cell from being erroneously programmed during reading.

While the above provides a full and complete description of the invention, various modifications, alternate constructions and equivalents will be apparent to those skilled in the art. For example, while the control gate, floating gate and spacers have been described above as being fabricated from a polysilicon, these elements may also be fabricated from any suitable compounds, such as one of the silicides. In addition, while specific process fabrication steps have been listed for the various embodiments, other process technology may be employed, as desired. Therefore, the above description and illustrations should not be construed as limiting the scope of the invention, which is defined by the appended claims.

What is claimed is:

1. A floating gate storage cell providing source-side injection of hot electrons comprising:
   a body of semi-conductor material having a substrate of a first conductivity type, a source region and a drain region each of a second conductivity type, and a channel region of the first conductivity type extending between the source region and the drain region;
   a control gate overlying said channel region;
   a floating gate insulated from said control gate and said source, drain and channel regions;
   said control gate and said floating gate being mutually aligned with one edge of each of said gates in the immediate vicinity of the drain region;
   a side wall spacer insulated from said source region, said control gate and said floating gate, said spacer being located in the immediate vicinity of the source region and spaced from the opposite edges of each of said gates to provide a gap therebetween; and
   means for providing a weak gate control region near the source region so that a relatively high channel electric field for promoting hot-electron injection is created under the weak gate control region when said device is biased for programming, said means for providing a weak gate control region including a gap between the opposite edges of each said gate and the source region.

2. The invention of claim 1 wherein said gap size is in the range from about 800 to about 3000 Å.

* * * * *